US009705315B2

(12) United States Patent
Tsao

(10) Patent No.: US 9,705,315 B2
(45) Date of Patent: Jul. 11, 2017

(54) PROTECTION CIRCUIT FOR PREVENTING AN OVER-CURRENT FROM AN OUTPUT STAGE

(71) Applicant: Elite Semiconductor Memory Technology Inc., Hsinchu (TW)

(72) Inventor: Szu-Chun Tsao, Yilan County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 338 days.

(21) Appl. No.: 14/685,611

(22) Filed: Apr. 14, 2015

(65) Prior Publication Data
US 2016/0308352 A1 Oct. 20, 2016

(51) Int. Cl.
*H02H 9/00* (2006.01)
*H02H 9/02* (2006.01)
*H03K 17/082* (2006.01)

(52) U.S. Cl.
CPC ......... *H02H 9/025* (2013.01); *H03K 17/0822* (2013.01)

(58) Field of Classification Search
CPC ...................................... H02H 9/025
USPC ............................................ 361/56
See application file for complete search history.

(56) References Cited

U.S. PATENT DOCUMENTS

| 5,617,283 A * | 4/1997 | Krakauer | H02H 9/046 361/111 |
| 5,838,146 A * | 11/1998 | Singer | H02H 9/046 323/270 |
| 6,061,219 A * | 5/2000 | Giffard | H02H 9/025 361/58 |
| 7,495,873 B2 * | 2/2009 | Bhattacharya | H01L 27/0266 361/56 |
| 8,947,156 B2 * | 2/2015 | Stultz | H03K 3/012 327/108 |
| 9,054,527 B1 * | 6/2015 | Fu | H03F 1/523 |

* cited by examiner

*Primary Examiner* — Stephen W Jackson
(74) *Attorney, Agent, or Firm* — Winston Hsu

(57) ABSTRACT

A semiconductor device including: an output stage, including a PMOS, an NMOS and an output terminal, wherein a source terminal of the PMOS is connected to a first supply voltage, a drain terminal of the PMOS is connected to a drain terminal of the NMOS and the output terminal, a source terminal of the NMOS is connected to a second supply voltage, and the output terminal outputs an output signal; and a protection circuit, including a first voltage clamping circuit, including a first transistor, a second transistor and a first switch, wherein the first transistor and the second transistor are for clamping a gate voltage of the PMOS of the output stage and are connected in series, the first switch is coupled to the first supply voltage and a node between the first transistor and the second transistor for selectively coupling the first supply voltage to the node.

14 Claims, 9 Drawing Sheets

US 9,705,315 B2

PROTECTION CIRCUIT FOR PREVENTING AN OVER-CURRENT FROM AN OUTPUT STAGE

BACKGROUND OF THE INVENTION

1. Field of the Invention

The present invention relates to a protection circuit, and more particularly, to a protection circuit for preventing an over-current from an output stage.

2. Description of the Prior Art

Advances in semiconductor technology have resulted in smaller electronic devices. Therefore, the ability of a device to resist heat and other factors which may damage the device is important. An output stage in an audio system should be able to load a large power. In some situations, however, an output terminal of the output stage will inevitably short to ground or to the supply voltage, causing an over current to be generated. If this over current passes through the output stage, it will generate a lot of heat which might cause irreparable damage to the small size output stage. In the prior art, diodes are used as a voltage clamping device for the output stage to pull down the current to a fixed value. However, the fixed current limit value is larger than the normal operating current value. As such, the output stage may be damaged because large limited current sustains in the output stage if the short condition is kept.

SUMMARY OF THE INVENTION

One of the objectives of the present invention is to provide a protection circuit which can prevent an over-current from the output stage and comprises a mechanism that can enable normal operation to resume.

According to an embodiment of the present invention, a semiconductor device, comprising: an output stage, comprising a PMOS, an NMOS and an output terminal, wherein a source terminal of the PMOS is connected to a first supply voltage, a drain terminal of the PMOS is connected to a drain terminal of the NMOS and the output terminal, a source terminal of the NMOS is connected to a second supply voltage, and the output terminal outputs an output signal; and a protection circuit, comprising a first voltage clamping circuit, comprising a first transistor, a second transistor and a first switch, wherein the first transistor and the second transistor are arranged to clamp a gate voltage of the PMOS of the output stage and are connected in series between the first supply voltage and a gate terminal of the PMOS, the first switch is coupled to the first supply voltage and a node between the first transistor and the second transistor, and the first switch is arranged to selectively couple the first supply voltage to the node between the first transistor and the second transistor.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
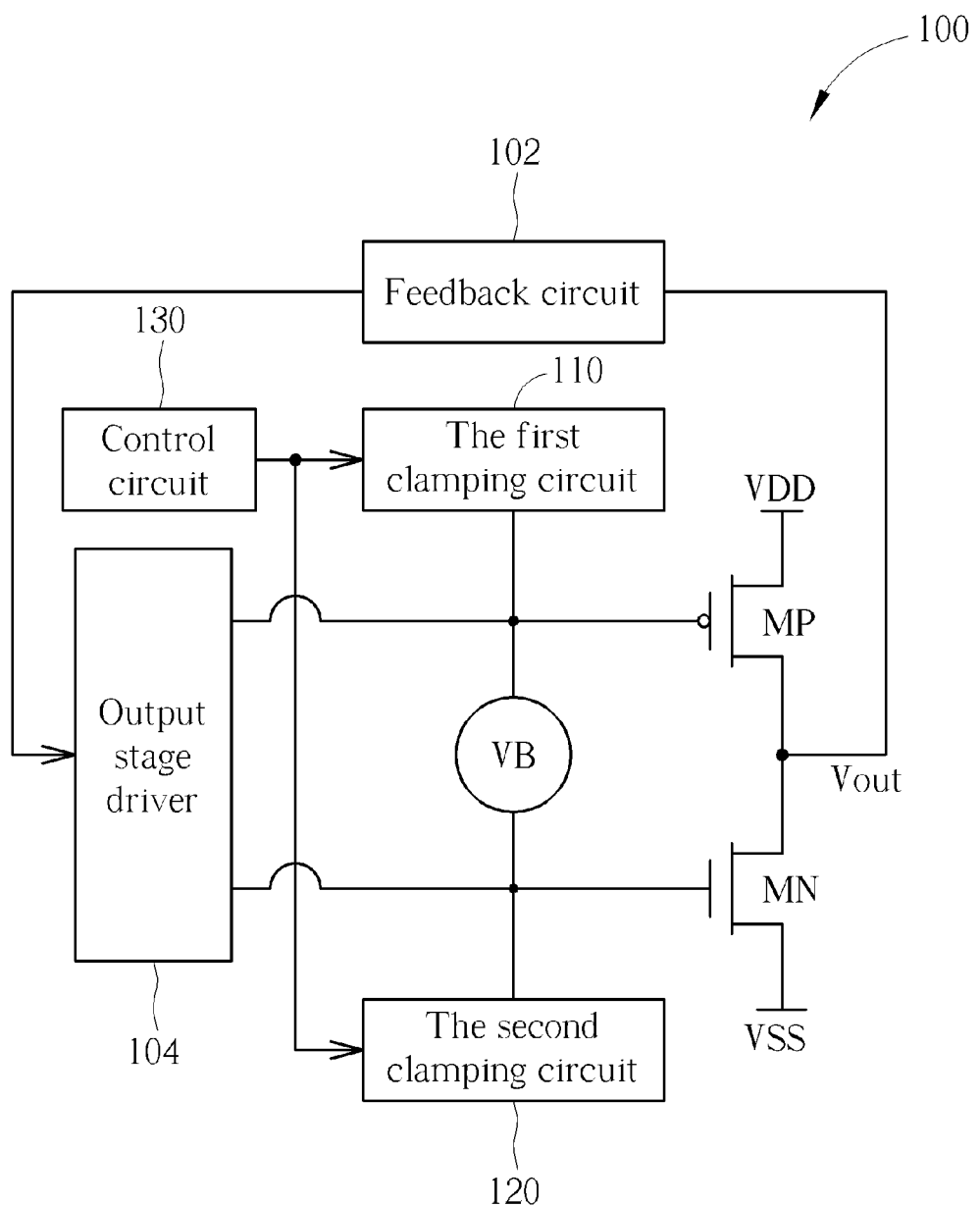
FIG. 1 is a diagram illustrating a protection circuit for preventing an over-current from an output stage according to an embodiment of the present invention.

FIG. 1 is a diagram illustrating a semiconductor device including a protection circuit 100 for preventing an over-current from an output stage according to an embodiment of the present invention. The protection circuit 100 comprises a feedback circuit 102, an output stage driver 104, a first voltage clamping circuit 110, a second voltage clamping circuit 120 and a control circuit 130. The output stage comprises two transistors MP and MN and an output terminal for outputting an output signal Vout. A voltage source VB is arranged to provide a bias voltage to the output stage, the feedback circuit 102 is arranged to feedback the output signal Vout to the output stage driver 104 to stabilize the system, the output stage driver 104 is arranged to drive the output stage, and the first clamping circuit 110 is arranged to clamp a gate voltage of the transistor MP of the output stage and operate in a fold-back control mode when the output voltage (i.e. the output signal Vout) goes down considerably to prevent a strong current from passing through the transistor MP which might cause damage to the transistor MP. Likewise, the second clamping circuit 120 is arranged to clamp a gate voltage of the transistor MN of the output stage and operate in the fold-back control mode when the output voltage (i.e. the output signal Vout) goes up considerably to prevent a strong current from passing through the transistor MN which might cause damage to the transistor MN. The control circuit 130 is arranged to control operations of the first voltage clamping circuit 110 and the second voltage clamping circuit 120 to operate in a fold-back control mode.

Figure 2:
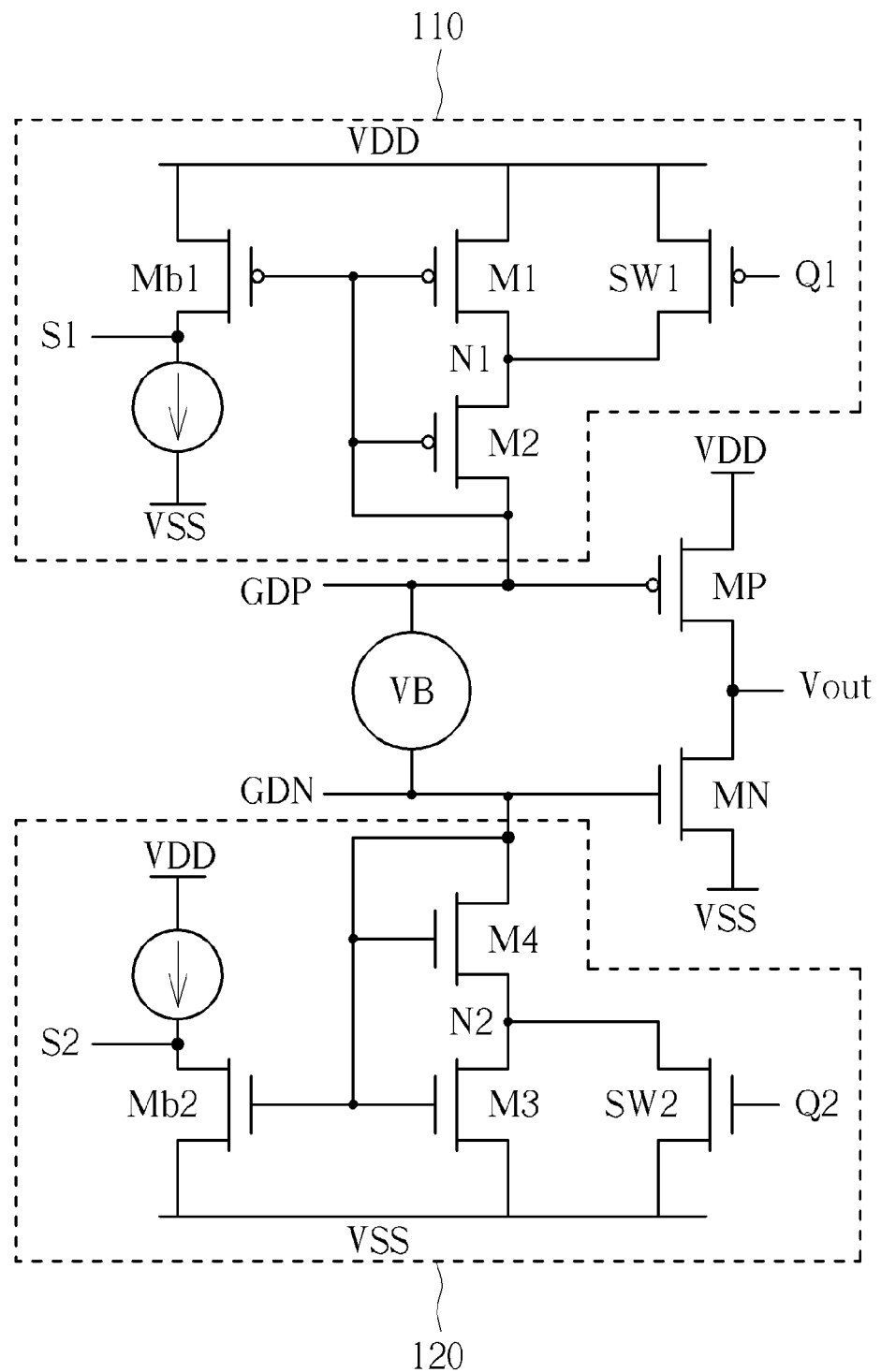
FIG. 2 is a diagram illustrating a voltage clamping circuit of the protection circuit illustrated in FIG. 1 according to an embodiment of the present invention.

FIG. 2 is a diagram illustrating the voltage clamping circuit of the protection circuit 100 according to an embodiment of the present invention, wherein the first voltage clamping circuit 110 comprises two transistors M1 and M2, a switch SW1 and a bias transistor Mb1. As shown in FIG. 2, the transistors M1 and M2 are arranged to clamp the gate voltage of the transistor MP of the output stage and are connected in series, wherein a source terminal of the transistor M1 is coupled to a first supply voltage VDD, a drain terminal of the transistor M2 is coupled to a gate terminal of the transistor MP of the output stage, a drain terminal of the transistor M1 and a source terminal of the transistor M2 are coupled to a node N1, and a gate terminal of the transistor M1 and a gate terminal of the transistor M2 are coupled to the gate terminal of the transistor MP of the output stage. The switch SW1 is coupled between the first supply voltage VDD and the node N1 and arranged to selectively couple the first supply voltage VDD to the node N1 to bypass the transistor M1. In this embodiment, the switch SW1 is implemented by a PMOS as shown in FIG. 2. The bias transistor Mb1 is arranged to mirror the current of the transistor M1. A gate terminal of the bias transistor Mb1 is coupled to the gate terminal of the transistor M1 of the output stage, a source terminal of the bias transistor Mb1 is coupled to the first supply voltage VDD, and a drain terminal of the bias transistor Mb1 is coupled to a current source.

The second voltage clamping circuit 120 comprises two transistors M3 and M4, a switch SW2 and a bias transistor Mb2. As shown in FIG. 2, the transistors M3 and M4 are arranged to clamp a gate voltage of the transistor MN of the output stage and are connected in series, wherein a source terminal of the transistor M3 is coupled to a second supply voltage VSS, a drain terminal of the transistor M4 is coupled to a gate terminal of the transistor MN of the output stage, a drain terminal of the transistor M3 and a source terminal of the transistor M4 are coupled to a node N2, and a gate terminal of the transistor M3 and a gate terminal of the transistor M4 are coupled to the gate terminal of the transistor MN of the output stage. The switch SW2 is coupled between the second supply voltage VSS and the node N2 and arranged to selectively couple the second supply voltage VSS to the node N2 to bypass the transistor M3. In this embodiment, the switch SW2 is implemented by an NMOS shown in FIG. 2. The bias transistor Mb2 is arranged to mirror the current of the transistor M3. A gate terminal of the bias transistor Mb2 is coupled to the gate terminal of the transistor M3, a source terminal of the bias transistor Mb2 is coupled to the second supply voltage VSS, and a drain terminal of the bias transistor Mb1 is coupled to a current source.

Figure 3:
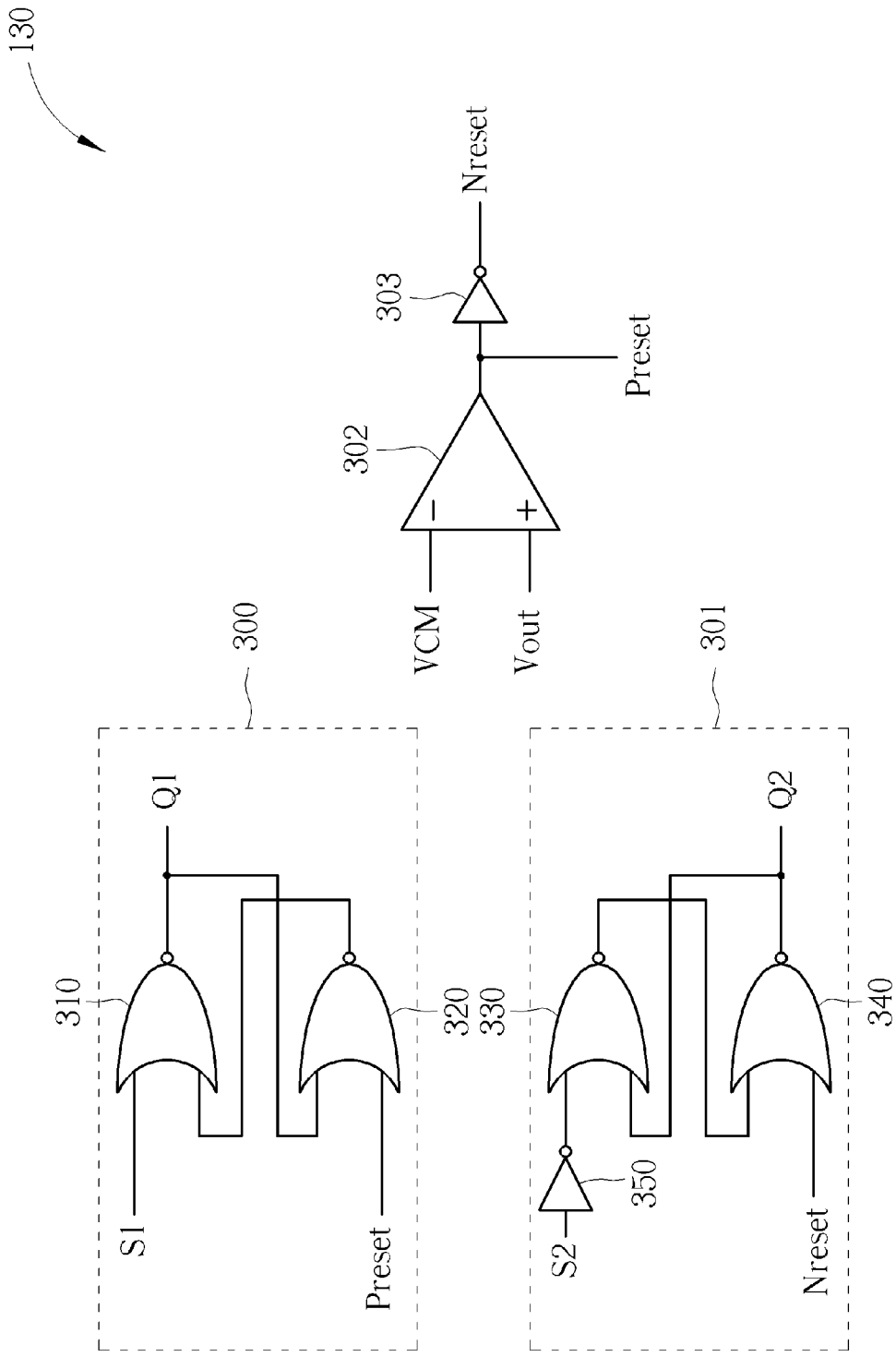
FIG. 3 is a diagram illustrating a control circuit of the protection circuit illustrated in FIG. 1 according to an embodiment of the present invention.

FIG. 3 is a diagram illustrating a control circuit 130 of the protection circuit 100 according to an embodiment of the present invention. The control circuit 130 comprises a first logic circuit 300, a second logic circuit 301, a comparator 302 and an inverter 303, wherein the first logic circuit 300 is arranged to generate a control signal Q1 to switch on or switch off the switches SW1 to control the first voltage clamping circuit 110 to operate in the fold-back control mode or the normal operation mode, and the second logic circuit 301 is arranged to generate a control signal Q2 to switch on or switch off the switches SW2 to control the second voltage clamping circuit 120 to operate in the fold-back control mode or the normal operation mode. The comparator 302 is arranged to compare the output signal Vout with a common voltage source VCM to generate a signal Preset for instructing the first voltage clamping circuit 110 to resume normal operation mode from the fold-back control mode, wherein VCM is the center of the voltage swing of the output signal Vout. The inverter 303 is arranged to invert the signal Preset for generating a signal Nreset for instructing the second voltage clamping circuit 120 to resume normal operation mode from the fold-back control mode. The first logic circuit 300 comprises two NOR gates 310 and 320. As shown in FIG. 3, the NOR gates 310 and 320 constitute an SR latch arranged to receive the signal S1 and the signal Preset to output the control signal Q1 from an output of the NOR gate 310 to a gate terminal of the switch SW1. The second logic circuit 301 comprises two NOR gates 330 and 340 and an inverter 350. The NOR gates 330 and 340 constitute an SR latch arranged to receive the signal S2 and the signal Nreset to output the control signal Q2 from an output of the NOR gate 340 to a gate terminal of the switch SW2. The architecture of the second logic circuit 301 is similar to the architecture of the first logic circuit 300, except there is an inverter 350 before the NOR gate 330 for assuring the correctness of the logic as shown in FIG. 3.

Figure 4:
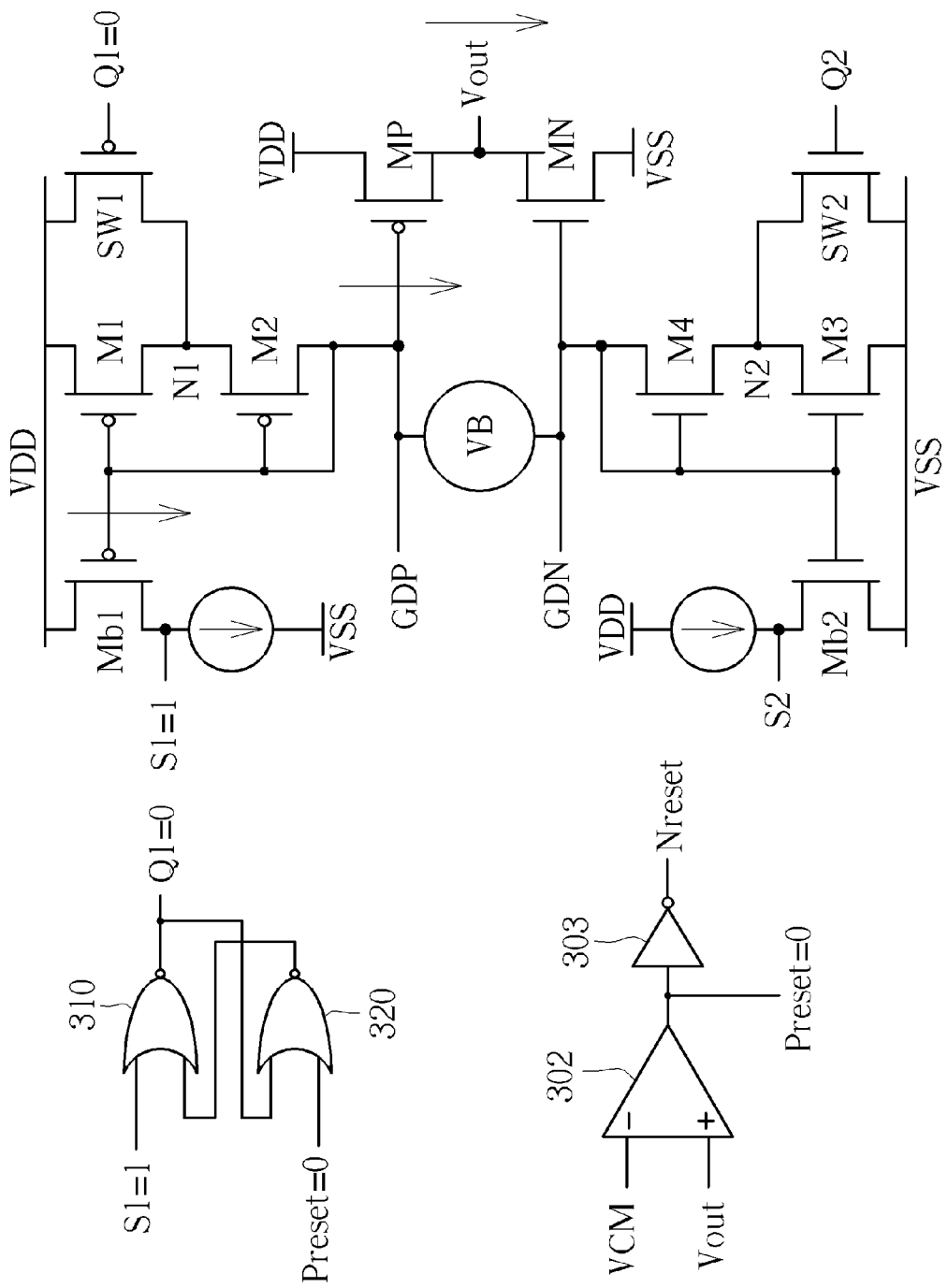
FIG. 4 is a diagram illustrating the protection circuit of FIG. 1 operating in a fold-back control mode when an output signal goes down considerably according to an embodiment of the present invention.

FIG. 4 is a diagram illustrating the protection circuit 100 operating in the fold-back control mode when the output signal Vout goes down considerably according to an embodiment of the present invention. If there is a malfunction which causes the output signal Vout to go down so that it is lower than a first threshold value, e.g. by shorting to the second supply voltage VSS, then the output stage driver 104 pulls down the gate voltage of the transistor MP of the output stage to increase the current passing through the transistor MP, which pulls up the output signal Vout to a stable level according to the output signal Vout provided by the feedback circuit 102. Referring to FIG. 4, as the gate voltage of the transistor MP decreases, the gate voltage of the bias transistor Mb1 decreases. The decrease of the gate voltage of the bias transistor Mb1 makes the current flowing through the bias transistor Mb1 larger so the signal S1 becomes logic value "1" and the first voltage clamping circuit 110 thus enters the fold-back control mode. Once the signal S1 becomes logic value "1", the control signal Q1 will become logic value "0" according to the characteristics of the SR latch, and this logic signal is transmitted to the gate terminal of the switch SW1 to switch on the switch SW1. The node N1 is coupled to the first supply voltage VDD via the switch SW1 after the switch SW1 is turned on. Owing to the adjustment of the voltage of the node N1, the gate voltage of the transistor M2 (i.e. the gate voltage of the transistor MP) goes up accordingly. Therefore, the current passing through the transistor MP is no longer strong which prevents damage to the transistor MP. Meanwhile, accompanying the increase of the gate voltage of the transistor MP (i.e. the gate voltage of the bias transistor Mb1), the transistor Mb1 mirrors the smaller current of the transistor M1 and the signal S1 thus becomes logic value "0" again. After the malfunction is removed and the output signal Vout exceeds the common voltage source VCM again, the first voltage clamping circuit 110 resumes normal operation mode.

Figure 5:
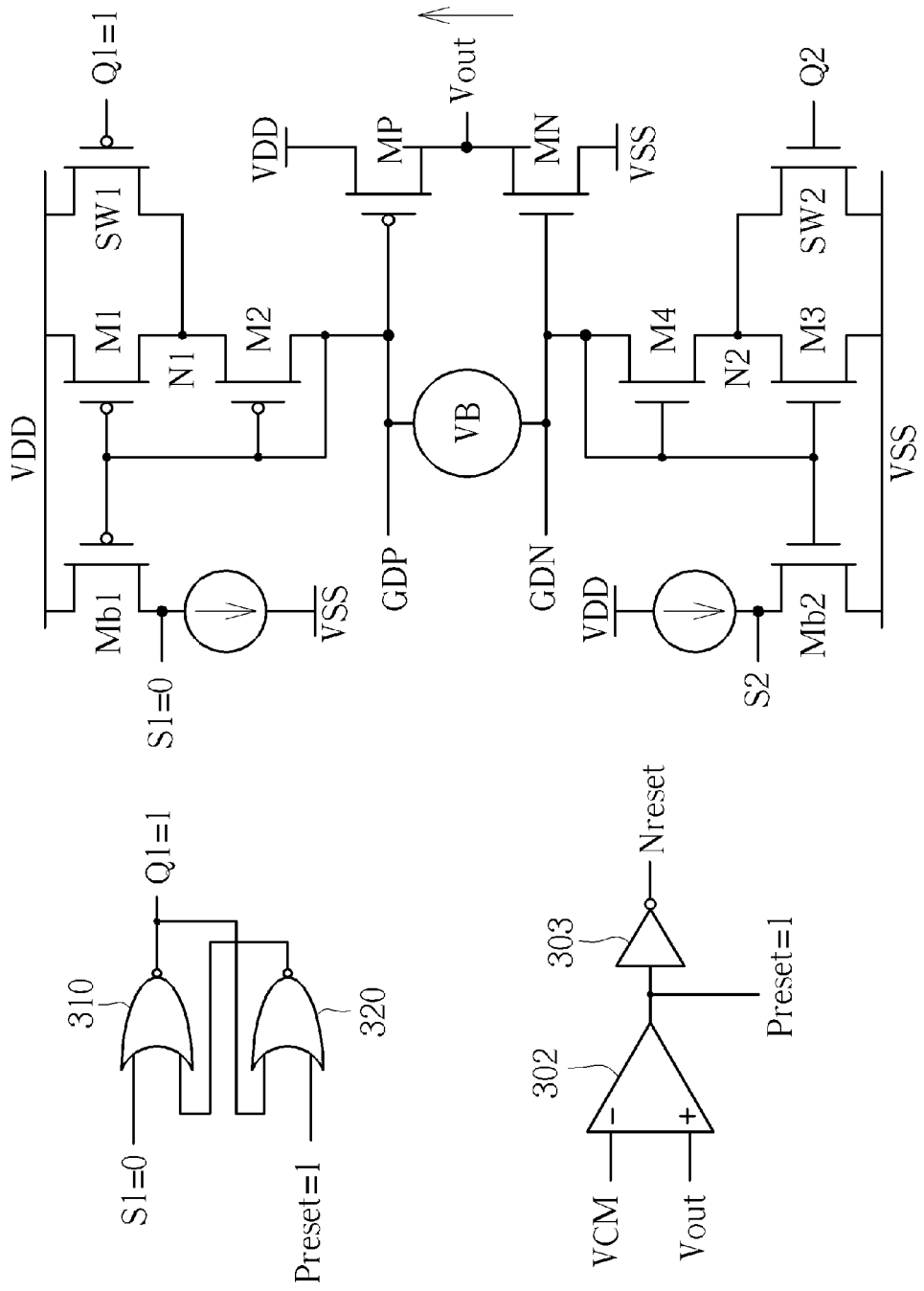
FIG. 5 is a diagram illustrating the protection circuit of FIG. 1 resuming normal operation mode from the fold-back control mode according to an embodiment of the present invention.

FIG. 5 is a diagram illustrating the protection circuit 100 resuming normal operation mode from the fold-back control mode according to an embodiment of the present invention. As shown in FIG. 5, the signal Preset outputted by the comparator 302 is logic value "1" due to the output signal Vout exceeding the common voltage source VCM and is transmitted to the NOR gate 320 of the first logic circuit 300 of the control circuit 130. The control signal Q1 thus becomes logic value "1" according to the characteristics of the SR latch, which makes the switch SW1 switch off. The first voltage clamping circuit 110 resumes normal operation mode from the fold-back control mode accordingly.

Figure 6:
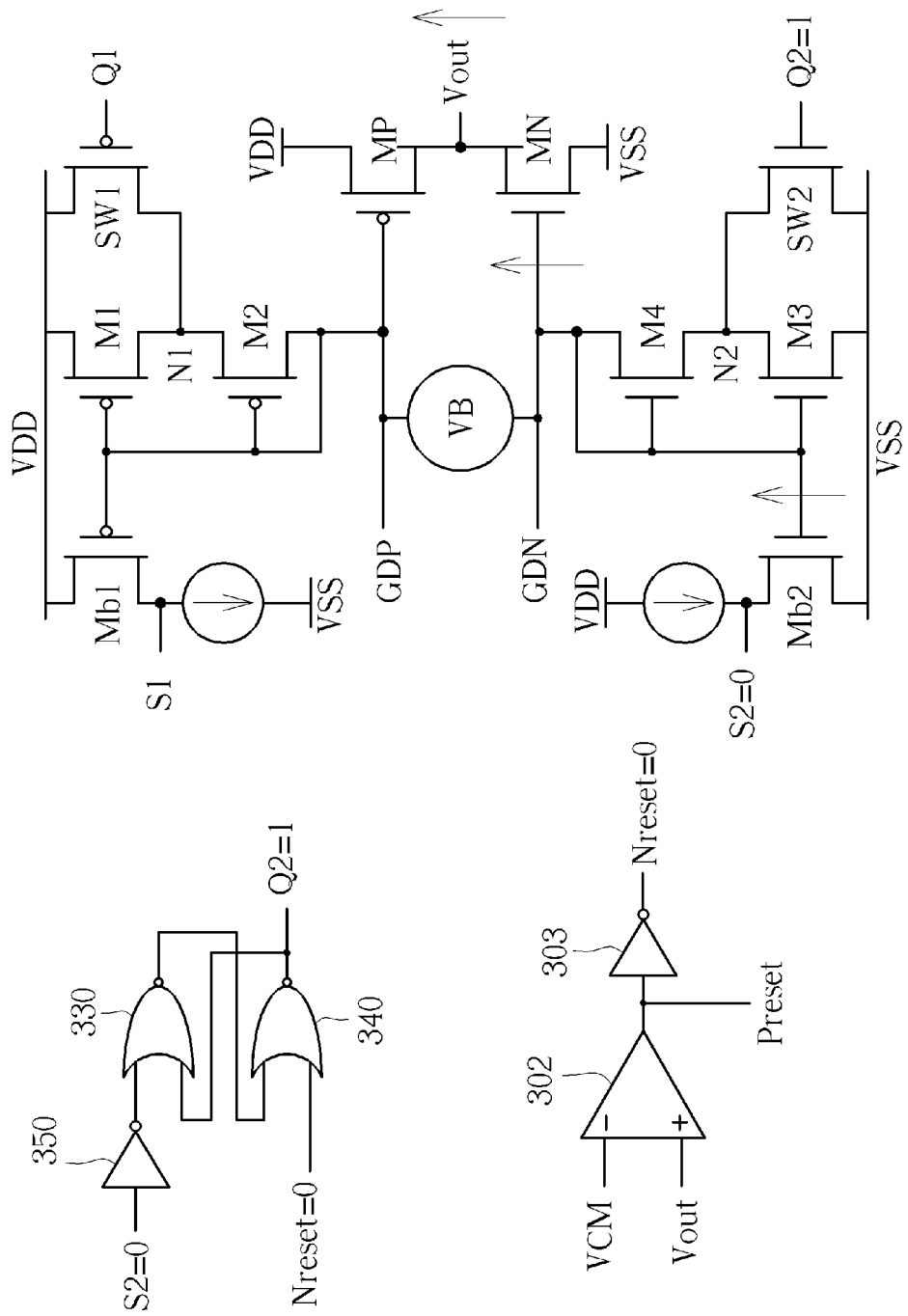
FIG. 6 is a diagram illustrating the protection circuit of FIG. 1 operating in the fold-back control mode when an output signal goes up considerably according to an embodiment of the present invention.

FIG. 6 is a diagram illustrating the protection circuit 100 operating in the fold-back control mode when the output signal Vout goes up considerably according to an embodiment of the present invention. If there is a malfunction which causes the output signal Vout to go up so that it is higher than a second threshold value, e.g. by shorting to the first supply voltage VDD, then the output stage driver 104 pulls up the gate voltage of the transistor MN of the output stage to increase the current passing through the transistor MN, which pulls down the output signal Vout to a stable level according to the output signal Vout provided by the feedback circuit 102. Referring to FIG. 6, as the gate voltage of the transistor MN increases, the gate voltage of the bias transistor Mb2 increases. The increase of the gate voltage of the bias transistor Mb2 makes the current flowing through the bias transistor Mb2 larger so the signal S2 becomes logic value "0" and the second voltage clamping circuit 120 thus enters the fold-back control mode. At the same time, because the output signal Vout is higher than the common voltage source VCM, the signal Nreset becomes logic value "0" as shown in FIG. 6. Therefore, the control signal Q2 is logic value "1" according to the characteristics of the SR latch and is transmitted to the gate terminal of the switch SW2 to switch on the switch SW2. The node N2 will then be coupled to the second supply voltage VSS via the switch SW2 after the switch SW2 is turned on. Owing to the adjustment of the voltage of the node N2, the gate voltage of the transistor M4 (i.e. the gate voltage of the transistor MN) goes down accordingly. The current passing through the transistor MN is no longer strong which prevents damage to the transistor MN. Meanwhile, accompanying the decrease of the gate voltage of the transistor MN (i.e. the gate voltage of the bias transistor Mb2), the transistor Mb2 mirrors the smaller current of the transistor M3 and the signal S2 thus becomes logic value "1" again. After the malfunction is removed and the output signal Vout is lower than the common voltage source VCM again, the second voltage clamping circuit 120 resumes normal operation mode.

Figure 7:
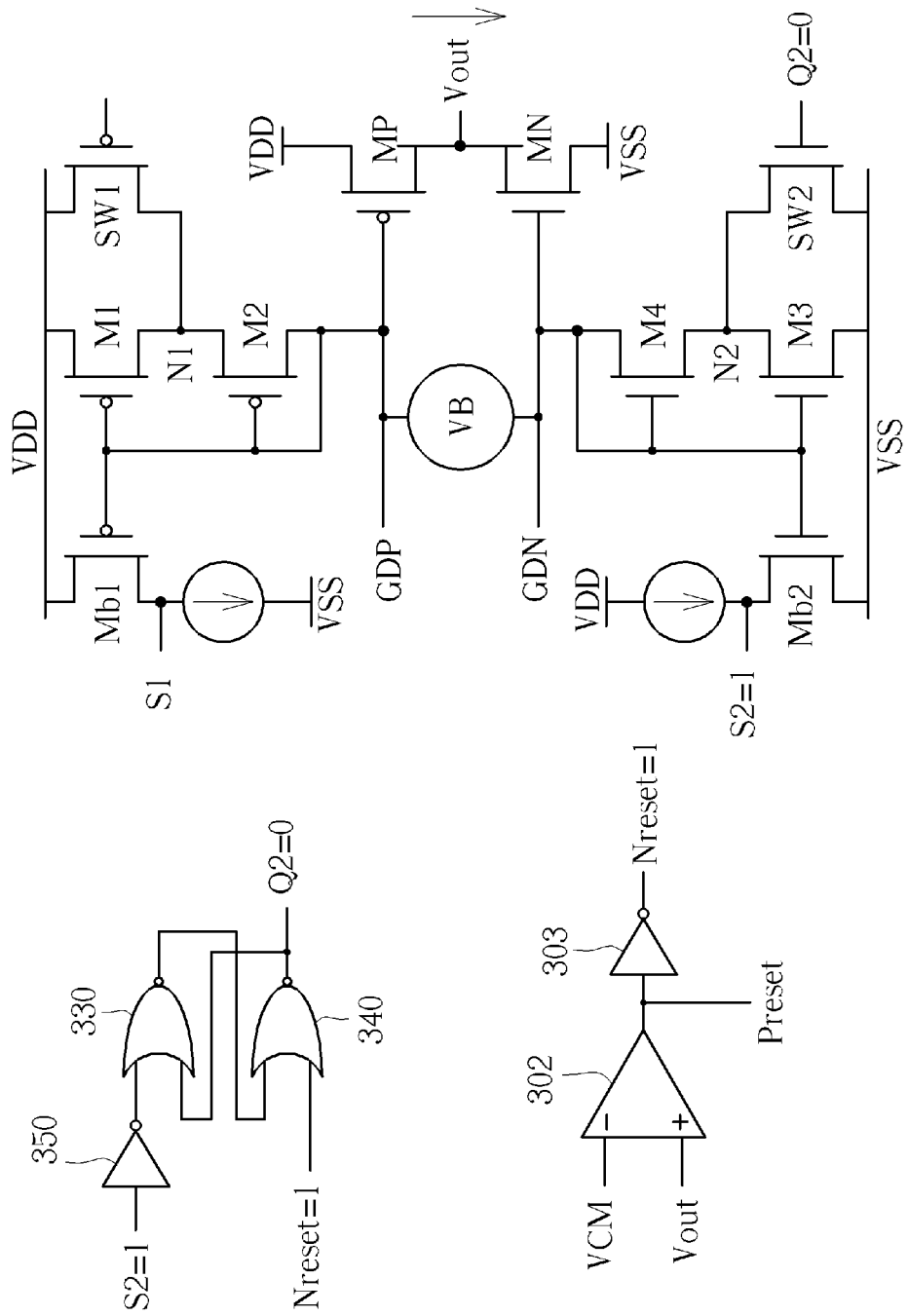
FIG. 7 is a diagram illustrating the protection circuit of FIG. 1 resuming normal operation mode from the fold-back control mode according to an embodiment of the present invention.

FIG. 7 is a diagram illustrating the protection circuit 100 resuming normal operation mode from the fold-back control mode according to an embodiment of the present invention. As shown in FIG. 7, the signal Nreset outputted by the inverter 303 is logic value "1" due to the output signal Vout being lower than the common voltage source VCM and is transmitted to the NOR gate 340 of the second logic circuit 301 of the control circuit 130. The control signal Q2 is thus logic value "0" according to the characteristics of the SR latch, which makes the switch SW2 switch off. The second voltage clamping circuit 120 resumes normal operation mode from the fold-back control mode accordingly.

Figure 8:
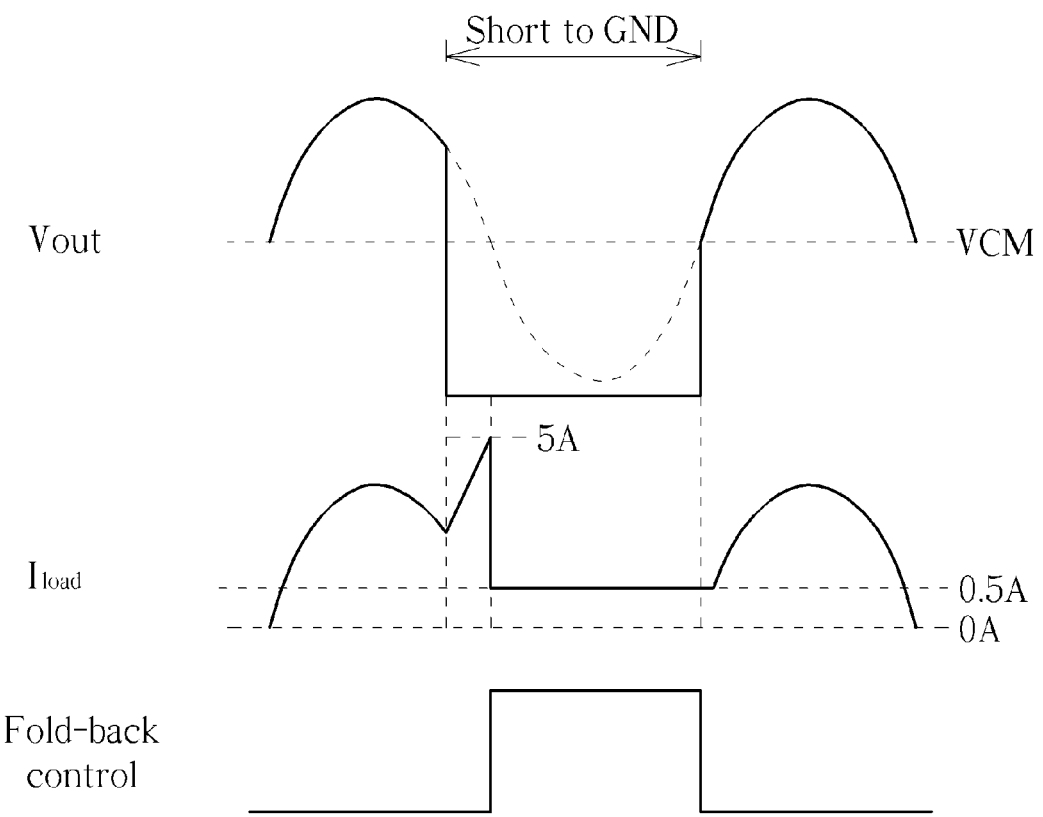
FIG. 8 is a diagram illustrating waveforms of the output signal and a loading current in the fold-back control mode and the normal operation mode according to an embodiment of the present invention.

FIG. 8 is a diagram illustrating the waveforms of the output signal Vout and the loading current $I_{load}$ in the fold-back control mode and the normal operation mode according to an embodiment of the present invention. As shown in FIG. 8, the output signal Vout is a sine wave centered around the voltage level VCM. When operating in the normal operation mode. If there is a malfunction which causes the output signal Vout to go down considerably, e.g. shorting to ground, the gate voltage of the transistor MP is pulled down to a very low level by the output stage driver 104 to increase the loading current $I_{load}$ passing through the transistor MP, and pulls up the output signal Vout to a stable level again. The voltage clamping circuit of the protection circuit 100 operates in the fold-back mode to pull down the loading current IL which prevents damage to the device. After the malfunction is removed and the output signal Vout exceeds the common voltage source VCM again, the protection circuit 100 resumes normal operation mode.

Figure 9:
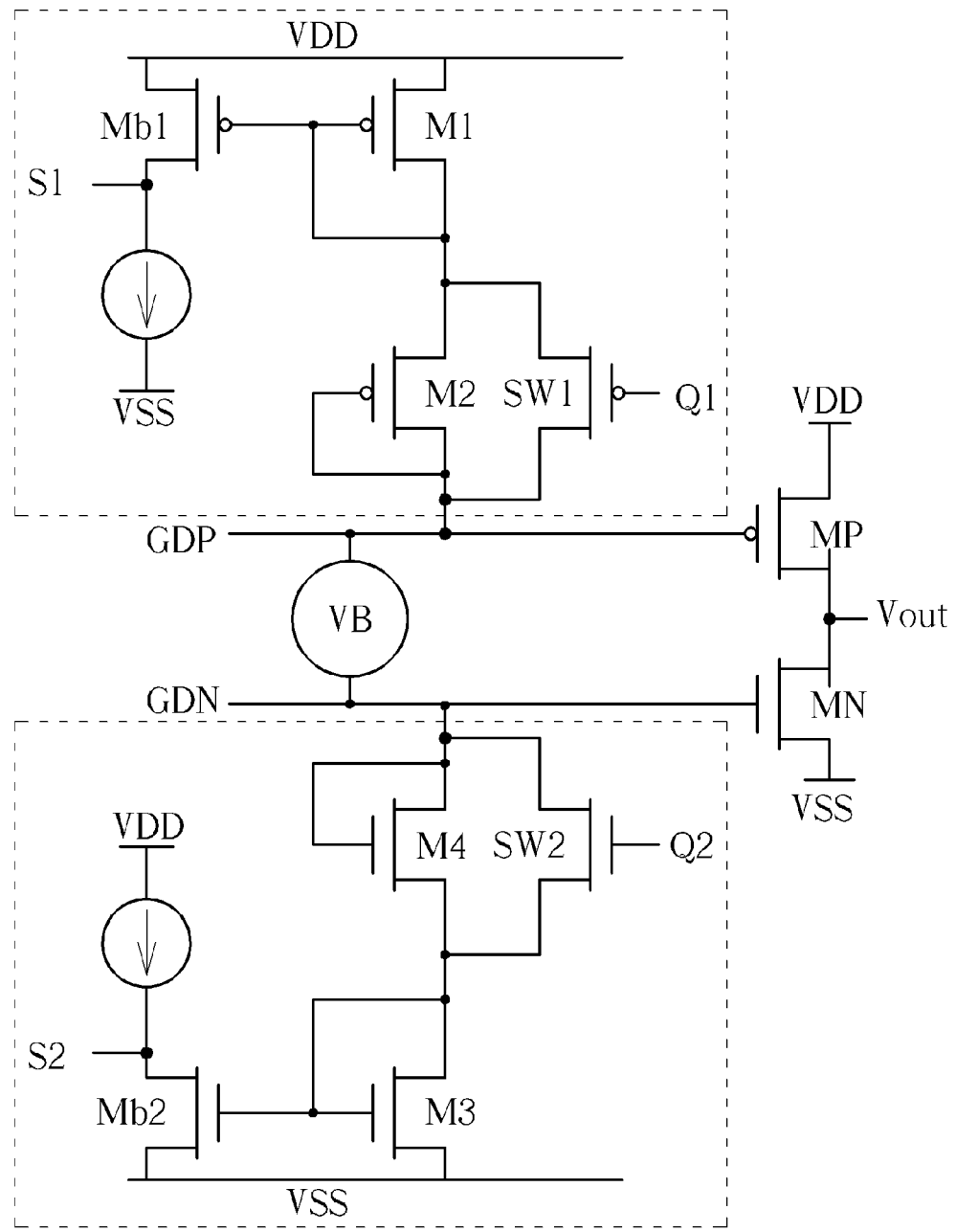
FIG. 9 is a diagram illustrating a protection circuit for preventing an over-current from an output stage according to another embodiment of the present invention.

In the embodiments shown in FIG. 2 to FIG. 7, the transistors M1, M2 and M3, M4 are implemented by PMOS and NMOS respectively. This is not a limitation of the present invention, however. In other embodiments, the transistors M1 to M4 can be implemented by other devices, e.g. diodes or diode-connected MOS as shown in FIG. 9, as long as they can clamp the gate voltage of the output stage. Likewise, in the embodiments shown in FIG. 2 to FIG. 7, the switches SW1 and SW2 are implemented by PMOS and NMOS respectively, but this is not a limitation of the present invention. In other embodiments, they can be implemented by any other switch, as long as they can couple the first supply voltage VDD and the second supply voltage VSS to the nodes N1 and N2, respectively. In addition, the SR latches of the first logic circuit 300 and the second logic circuit 301 can also be implemented by other architecture, as long as they can generate the control signals Q1 and Q2 to the switches SW1 and SW2, respectively, according to voltage levels of the gate terminals of the transistors MP and MN of the output stage. One skilled in the art should understand these alternative designs after reading the embodiment described above. These alternative designs fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   an output stage, comprising a PMOS, an NMOS and an output terminal, wherein a source terminal of the PMOS is connected to a first supply voltage, a drain terminal of the PMOS is connected to a drain terminal of the NMOS and the output terminal, a source terminal of the NMOS is connected to a second supply voltage, and the output terminal outputs an output signal; and
   a protection circuit, comprising
      a first voltage clamping circuit, comprising a first transistor, a second transistor and a first switch, wherein the first transistor and the second transistor are arranged to clamp a gate voltage of the PMOS of the output stage and are connected in series between the first supply voltage and a gate terminal of the PMOS, the first switch is coupled to the first supply voltage and a node between the first transistor and the second transistor, and the first switch is arranged to selectively couple the first supply voltage to the node between the first transistor and the second transistor.

2. The semiconductor device of claim 1, wherein the first transistor is a PMOS and the second transistor is a PMOS, a source terminal of the first transistor is coupled to the first supply voltage, a drain terminal of the first transistor is coupled to a source terminal of the second transistor, a drain terminal of the second transistor is coupled to a gate terminal of the PMOS of the output stage, and the first switch is arranged to selectively couple the first supply voltage to the drain terminal of the first transistor.

3. The semiconductor device of claim 2, wherein a gate terminal of the first transistor and a gate terminal of the second transistor are coupled to the gate terminal of the PMOS of the output stage.

4. The semiconductor device of claim 1, further comprising:
a control circuit, for switching on or switching off the first switch according to a voltage level of a gate terminal of the PMOS of the output stage.

5. The semiconductor device of claim 4, wherein the control circuit comprises:
a logic circuit, for receiving a first signal and a second signal to generate a control signal to switch on or switch off the first switch, wherein the first signal and the second signal are determined according to the voltage level of the gate terminal of the PMOS of the output stage.

6. The semiconductor device of claim 5, wherein the control circuit further comprises:
a comparator, for comparing a common voltage of signals applied to the gate terminals of the PMOS and the NMOS of the output stage with the output signal to generate one of the first signal and the second signal.

7. The semiconductor device of claim 5, wherein the first voltage clamping circuit further comprises:
a bias transistor, wherein a source terminal of the bias transistor is coupled to the first supply voltage, a gate terminal is coupled to the gate terminal of the PMOS of the output stage, and a voltage of a drain terminal of the bias transistor serves as one of the first signal and the second signal.

8. The semiconductor device of claim 1, wherein the protection circuit further comprising:
a second voltage clamping circuit, comprising a third transistor,
a fourth transistor and a second switch, wherein the third transistor and the fourth transistor are arranged to clamp a gate voltage of the NMOS of the output stage and are connected in series, the second switch is coupled to the second supply voltage and a node between the third transistor and the fourth transistor, and the second switch is arranged to selectively couple the second supply voltage to the node between the third transistor and the fourth transistor.

9. The semiconductor device of claim 8, wherein the first transistor is a PMOS and the second transistor is a PMOS, a source terminal of the first transistor is coupled to the first supply voltage, a drain terminal of the first transistor is coupled to a source terminal of the second transistor, a drain terminal of the second transistor is coupled to a gate terminal of the PMOS of the output stage, and the first switch is arranged to selectively couple the first supply voltage to the drain terminal of the first transistor; the third transistor is a NMOS and the fourth transistor is a NMOS, a source terminal of the third transistor is coupled to the second supply voltage, a drain terminal of the second transistor is coupled to a source terminal of the fourth transistor, a drain terminal of the fourth transistor is coupled to a gate terminal of the NMOS of the output stage, and the second switch is arranged to selectively couple the second supply voltage to the drain terminal of the third transistor.

10. The semiconductor device of claim 9, wherein a gate terminal of the first transistor and a gate terminal of the second transistor are coupled to the gate terminal of the PMOS of the output stage; and a gate terminal of the third transistor and a gate terminal of the fourth transistor are coupled to the gate terminal of the NMOS of the output stage.

11. The semiconductor device of claim 8, further comprising:
a control circuit, for switching on or switching off the first switch according to a voltage level of a gate terminal of the PMOS of the output stage, and switching on or switching off the second switch according to a voltage level of a gate terminal of the NMOS of the output stage.

12. The semiconductor device of claim 11, wherein the control circuit comprises:
a first logic circuit, for receiving a first signal and a second signal to generate a first control signal to the first switch to switch on or switch off the first switch, wherein the first signal and the second signal are determined according to the voltage level of the gate terminal of the PMOS of the output stage; and
a second logic circuit, for receiving a third signal and a fourth signal to generate a second control signal to switch on or switch off the second switch, wherein the third signal and the fourth signal are determined according to the voltage level of the gate terminal of the NMOS of the output stage.

13. The semiconductor device of claim 12, wherein the control circuit further comprises:
a comparator, for comparing a common voltage of the output terminal with the output signal to generate one of the first signal and the second signal, or one of the third signal and the fourth signal.

14. The semiconductor device of claim 12, wherein the first voltage clamping circuit further comprises:
a first bias transistor, wherein a source terminal of the bias transistor is coupled to the first supply voltage, a gate terminal is coupled to the gate terminal of the PMOS of the output stage, and a voltage of a drain terminal of the bias transistor serves as one of the first signal and the second signal; and
the second voltage clamping circuit further comprises:
a second bias transistor, wherein a source terminal of the bias transistor is coupled to the second supply voltage, a gate terminal is coupled to the gate terminal of the NMOS of the output stage, and a voltage of a drain terminal of the second bias transistor serves as one of the third signal and the fourth signal.

* * * * *